United States Patent [19]

McCambridge

[11] Patent Number: 4,754,466
[45] Date of Patent: Jun. 28, 1988

[54] METHOD FOR CHIP SELECTION AND COUNTING IN A DIGITAL PULSE WIDTH MODULATED INTEGRATED CIRCUIT

[75] Inventor: John M. McCambridge, Northville, Mich.

[73] Assignee: Chrysler Motors Corporation, Highland Park, Mich.

[21] Appl. No.: 866,622

[22] Filed: May 22, 1986

[51] Int. Cl.⁴ .............................................. H03K 7/08
[52] U.S. Cl. ...................................... 375/22; 332/9 R
[58] Field of Search ... 364/200 MS File, 900 MS File; 375/22; 332/9 R

[56] References Cited

U.S. PATENT DOCUMENTS

| | | | |
|---|---|---|---|
| 4,001,728 | 1/1977 | Schneider | 340/347 AD |
| 4,065,765 | 12/1977 | Wagner | 340/347 DD |
| 4,072,206 | 2/1978 | Larson et al. | 364/426 |
| 4,099,109 | 7/1978 | Abbondanti | 363/41 |
| 4,105,939 | 8/1978 | Culbertson | 363/137 |
| 4,353,115 | 10/1982 | Ruble et al. | 363/42 |
| 4,386,311 | 5/1983 | Bafaro | 363/21 |
| 4,689,802 | 8/1987 | McCambridge | 364/200 X |

*Primary Examiner*—Thomas M. Heckler
*Attorney, Agent, or Firm*—Mark P. Calcaterra

[57] ABSTRACT

A digital pulse width modulator for generating output frequencies with adjustable pulse widths that can be controlled by a microcomputer interface. A method to perform a DPWM chip select and to control the latching, shifting and counting of DPWM counters and registers is also presented. This allows the traditional uses of PWMs to enter the realm of microcomputer systems.

3 Claims, 3 Drawing Sheets

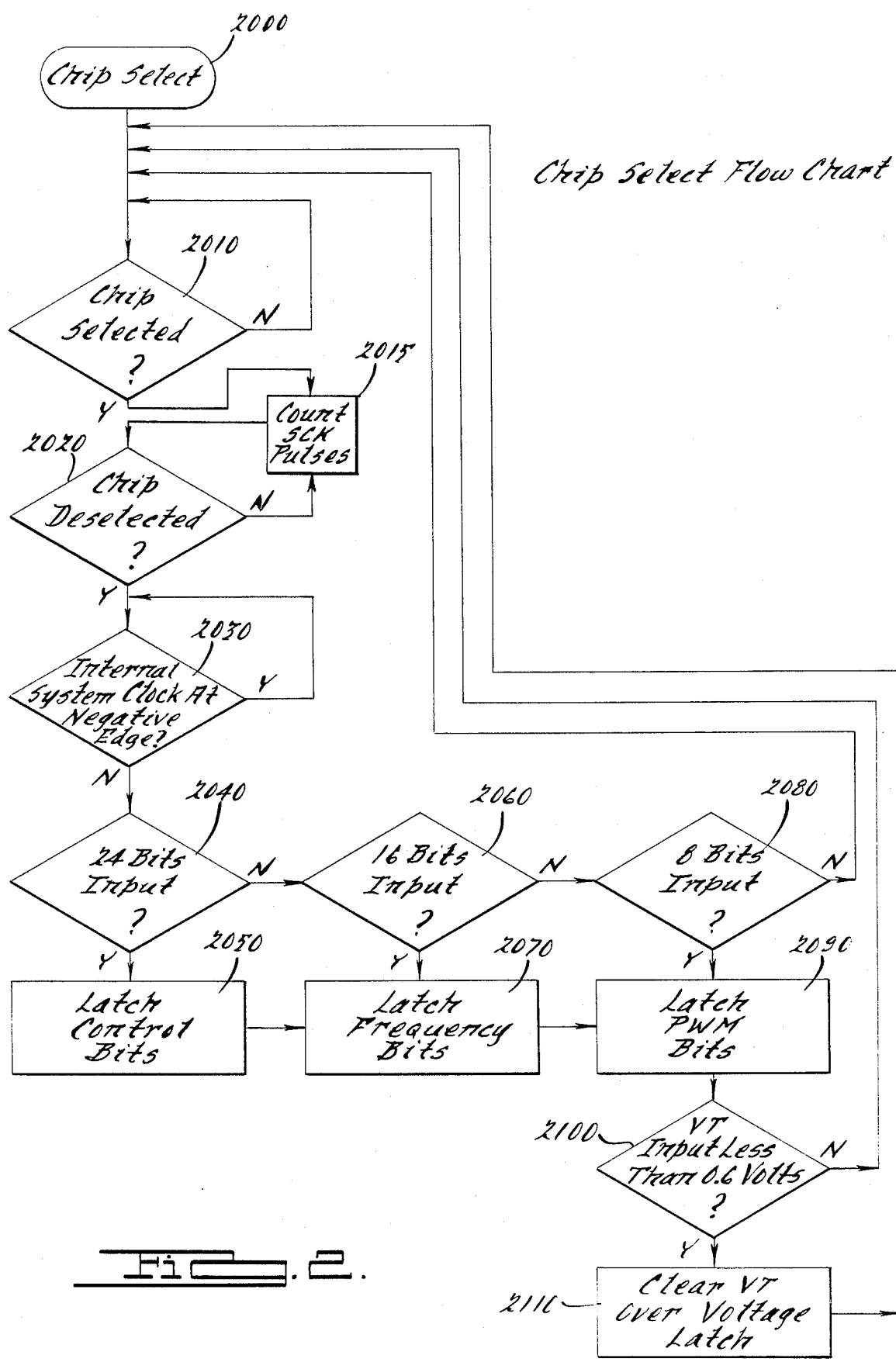

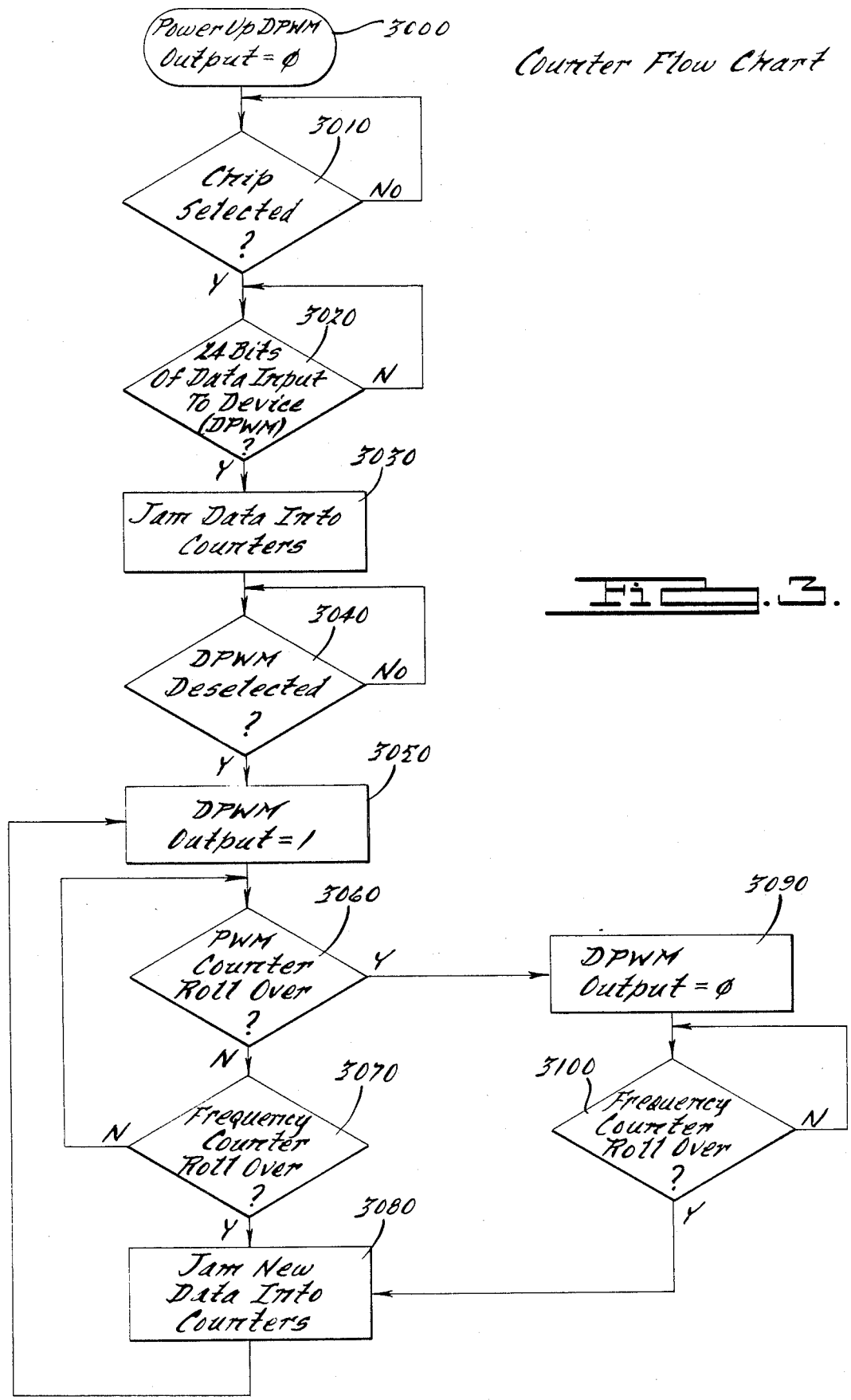

METHOD FOR CHIP SELECTION AND COUNTING IN A DIGITAL PULSE WIDTH MODULATED INTEGRATED CIRCUIT

BACKGROUND OF THE INVENTION

1. Field of the Invention

The digital pulse width modulator (DPWM) is a device which allows creation of an output, a designated frequency and pulse width, and further allows the varying of the pulse width (on-time) of frequency of the waveform.

Typically, the device is set up at one frequency, and on-time of the waveform is made larger or smaller or left alone to produce the desired effect.

Applications for this device in microprocessor circuits are:

1. voice synthesis where the output pulse width is low pass filtered to produce an analog waveform. The larger the pulse width, the larger the analog voltage at the output of the low pass filter; the smaller the pulse width, the smaller the analog voltage at the output of the low pass filter.
2. a vacuum fluorescent power supply. Here the output pulse width drives a transistor which drives current through a coil, so the larger the pulse width, the higher the current and the higher the voltage generated. The smaller the pulse width, the smaller the current, and the smaller the voltage generated.

2. Prior Art

Examples of pulse width modulators are described in the following U.S. Patents:

U.S. Pat. No. 4,386,311 to Michael P. Bafaro; "Dual Slope Pulse Width Modulation Regulator And Control System"; discloses a dual slope pulse width modulation regulator for separate control of two independently operative power supplies.

U.S. Pat. No. 4,353,115 to Ray Ruble et al.; "Apparatus For Synthesizing A Sinusoidal Output"; discloses a sinusoidal synthesizer which produces a sinusoidal AC power output from a modulated pulse train. A pulse width modulator is used in the control of an output voltage in combination with a high gain negative feedback signal.

U.S. Pat. No. 4,105,939 to Charles H. Culbertson; "Direct Digital Technique For Generating An AC Waveform"; discloses the generation of a three-phase pulse width modulated output for driving the power stages with a rod control mechanism in a nuclear reactor facility.

U.S. Pat. No. 4,099,109 to Alberto Abbondanti; "Digital Apparatus For Synthesizing Pulse Width Modulated WaveForms And Digital Pulse Width Modulated Control System"; discloses an induction motor driver with adjustable speeds which responds to stored pulse width modulated waveforms which represent predetermined patterns of output voltage levels.

U.S. Pat. No. 4,072,206 to Gerald L. Larson et al.; "Device For Regulating Vehicle Road Speed"; utilizes a control pulse width for each mile per hour vehicle speed variation about a set speed.

U.S. Pat. No. 4,065,765 to Peter B. Wagner; "Pulse-Width Demodulator And Information Storage Device"; discloses a device to convert a pulse width modulated word into a digital format.

U.S. Pat. No. 4,001,728 to Wolfger Schneider; "Digital Method Of Pulse Width Modulation"; discloses a method of encoding the information in a pulse width modulated signal.

SUMMARY OF THE INVENTION

This digital pulse width modulator integrated circuit (DPWM IC) is used for generating output frequencies with adjustable pulse widths (on times). Information can be encoded in these pulse widths.

Historically, pulse width modulators (PWM) have found uses in almost an infinite number of applications, such as communications, servo-motor controllers, D/A conversion, switching power supplies and dimming circuits, to name a few.

Prior art PWMs usually contain digital and analog circuitry to produce the varying pulse widths, in response to an input analog waveform.

The need existed to have a pulse width modulator, of total digital design, that could be controlled by the microprocessor interface.

This is desirable because microprocessors are prevalent in today's circuits. This allows the traditional uses of PWMs to enter the realm of microprocessor systems.

The DPWM in its preferred embodiment is a custom integrated circuit (IC) and is capable of being connected to a serial peripheral interface (SPI) on a microprocessor or microcomputer.

Upon power up, the output of the DPWM chip remains at a logical zero state until the DPWM IC is selected by the microcomputer, 24 bits of data are input into the DPWM IC, and the IC is deselected by the microcomputer.

The 24 bits of data are input such that the first 8 bits contain the power up/down and clock divider information; the second 8 bits contain the frequency data; and the third 8 bits contain the pulse width modulated data.

The data is input such that the most significant bit (MSB) is input first. The data is clocked in on a rising edge of the serial clock (SCK) pin by the microcomputer.

After power up, upon reception of the 24th bit, the data in the shift registers is transferred to the control, frequency and pulse width modulation registers on the falling edge of the 24th SCK pulse. At this point, the device will not start counting until the DPWM IC is deselected. This is true only after a power up condition.

It is an object of the subject invention to provide a pulse width modulator of all digital design which is capable of communication with a microcomputer via an SPI port.

It is a further object of the subject invention to provide a chip select method and a counter control method for a DPWM.

DESCRIPTION OF THE DRAWINGS

Other objects, features and advantages of the present invention will become more fully apparent from the detailed description of the preferred embodiment, the appended claims and the accompanying drawings in which:

FIG. 2 is a flowchart showing the chip select method in a DPWM IC; and

FIG. 3 is a flowchart showing the DPWM counter methods.

DETAILED DESCRIPTION OF THE PREFERRED EMBODIMENT

Figure 1:
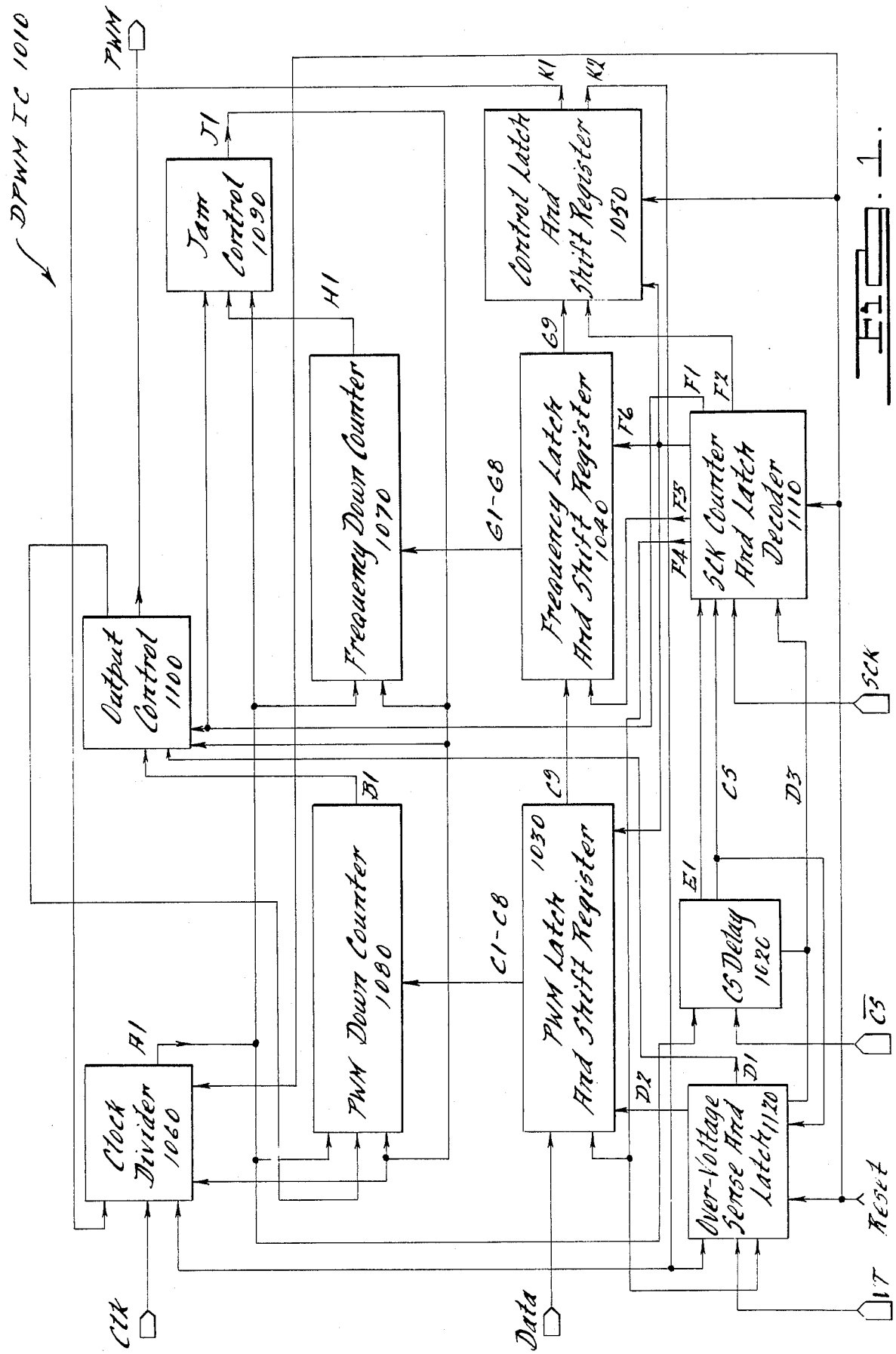
FIG. 1 is a block diagram of the digital pulse width modulated integrated circuit.

The method described and claimed herein are based on an understanding of the hardware as described and claimed in a commonly owned patent application filed on the same day as the subject patent application and entitled "Digital Pulse Width Modulator," now U.S. Pat. No. 4,689,802 which is hereby expressly incorporated by reference.

Also hereby expressly incorporated by reference is a commonly owned U.S. patent application Ser. No. 06/812,473 entitled "Power Supply For Vacuum Fluorescent Displays" which was filed on Dec. 23, 1985, now U.S. Pat. No. 4,719,389, along with SAE Paper No. 830046 entitled "High Efficiency Low Cost Vacuum Fluorescent Display Power Supply."

Referring to FIG. 1, the digital pulse width modulator (DPWM) integrated circuit (IC) 1010 is illustrated with all of its major blocks. As this circuit is adequately described in the co-pending patent application which has been incorporated into this description by reference, the description shall not be repeated here.

Referring now to FIG. 2, the chip select methods employed in the DPWM IC 1010 are illustrated in Flowchart format.

When the DPWM IC 1010 is powered up, one of the first things utilized is the chip select method begun in block 2000. Initially, the DPWM IC 1010 checks to see whether it has been selected in block 2010 and waits until it sees the appropriate signal on the $\overline{CS}$ pin which, as described in the co-pending patent application, is fed into the CS delay circuit 1020. SCK pulses are then counted in block 2015.

Once the DPWM IC 1010 has been selected in block 2010 and SCK pulses are counted in block 2015, the method falls through to block 2020 to see whether the chip has been deselected and waits until that has occurred while counting SCK pulses in block 2015.

One deselected, the method falls through to block 2030 to check the internal system clock to see whether the clock signal is at a negative edge. The method waits until the internal clock is at a negative edge and then falls through to block 2040 to detect if 24 bits of data were input. If 24 bits of data were not input, the method branches to block 2060 to check for 16 bit data input or to block 2080 for an 8 bit input. If an 8 bit data input has not been read into the DPWM IC 1010, the method branches back to the beginning of the routine to wait for the DPWM IC 1010 to be selected in block 2010.

Returning to block 2040, if a 24 bit data input was read into the DPWM IC 1010, the routine falls through to block 2050 to latch the control bits in the control latch and shift register 1050 before branching to latch the frequency bits in block 2070 in the frequency latch and shift register 1040 and then moving to block 2090 to latch the PWM bits in the PWM latch and shift register 1030.

A similar path is followed if a 16 bit data input is present as checked in block 2060 in which case, the routine falls through from block 2060 to block 2070 and then to 2090.

Likewise, if an 8 bit data word is to be input to the DPWM IC 1010 as checked in block 2080, the method falls through directly to block 2090.

Once all the bits are latched from blocks 2050, 2070 and/or 2090, the routine falls through to block 2100 to check the voltage on pin VT. If the voltage input is less than 0.75 volts±0.15 volts (i.e., less than 0.6 volts), the routine clears the over-voltage sense and latch circuit in block 1120 and returns to wait for the DPWM IC 1010 to be selected in block 2010.

If the VT voltage input is greater than 0.6 volts, the routine returns to wait for the DPWM IC 1010 to be selected in block 2010.

Referring now to FIG. 3, the counter method is illustrated in flowchart format.

Upon power up, the DPWM IC 1010 output is set equal to 0 as shown in block 3000.

Once the DPWM IC 1010 has been selected in block 3010, the method waits for 24 bits of data input to the DPWM IC 1010 device in block 3020 before jamming the data into the counters in block 3030.

Next, the method waits for the DPWM IC 1010 to be deselected in block 3040 before setting the DPWM IC 1010 output equal to a logical 1 in block 3050.

In block 3060, the PWM down counter is checked for a roll-over condition. If the PWM down counter 1080 is not in a roll-over condition, then the frequency down counter 1070 is checked in block 3070 for a roll-over condition. If the frequency down counter 1070 is not in a roll-over condition, the method returns to block 3060 to recheck the PWM down counter 1080 for a roll-over condition.

If the frequency down counter 1070 is in a roll-over condition as checked in block 3070, the method falls through to block 3080 to jam new data into the counters before returning to block 3050 to set the DPWM IC 1010 chip's output equal to a logical 1 in block 3050.

Returning to block 3060, if the PWM down counter in block 1080 is in a roll-over condition, the method branches to block 3090 to set the DPWM IC 1010 output equal to a logical 0. Once this is accomplished, the method falls through to block 3100 to check the frequency down counter 1070. Once the frequency down counter 1070 is in a roll-over condition, the method branches back to block 3080 to jam new data into the counters before completing the rest of the routine.

While the present invention has been disclosed in connection with the preferred embodiment thereof, it should be understood that there may be other embodiments which fall within the spirit and scope of the invention and that the invention is susceptible to modification, variation and change without departing from the proper scope or fair meaning of the following claims.

I claim:

1. In a microcomputer system with a serial peripheral interface (SPI) for data bit transfers including control bits, frequency bits and PWM bits to user peripherals, a digital pulse width modulator (DPWM) for varying the frequency and pulse width of a waveform as desired by a user microcomputer where the DPWM includes means to receive input signals, means to generate output signals, an internal system clock, a control latch and shift register, a frequency latch and shift register, and a PWM latch and shift register, a chip select method for a DPWM comprising:
waiting for an input signal from the user microcomputer to indicate that the DPWM is to be selected by the user microcomputer;
once selected, reading input signals from the user microcomputer;
waiting for an input signal from the user microcomputer to indicate that the DPWM is to be deselected by the user microcomputer;

waiting for the internal system clock signal to reach a predetermined condition;

once the predetermined condition is reached, latching control bits into the control latch and shift register, the frequency latch and shift register and the PWM latch and shift register if a 24 bit update was sent to the DPWM from the user microcomputer;

latching frequency bits into the frequency latch and shift register and the PWM latch and shift register if a 16 bit update was sent to the DPWM from the user microcomputer; and latching PWM bits into the PWM Latch and shift register if an 8 bit update was received by the DPWM from the user microcomputer; and returning to wait for an input signal to indicate that the DPWM is to be selected.

2. The chip select method of claim 1 where the DPWM further comprises an over-voltage sense and latch circuit, the chip select method further comprising:
monitoring an external voltage, generating a predetermined signal in the over-voltage sense and latch circuit to turn the DPWM output signal off if the external voltage varies from a preselected amount.

3. In a microcomputer system for data bit transfers to user peripherals with a serial peripheral interface (SPI), a digital pulse width modulator (DPWM) for varying the frequency and pulse width of a waveform as desired by the user microcomputer where the DPWM includes means to receive input signals, means to generate output signals, an internal system clock, a control latch and shift register, a frequency latch and shift register, and a PWM latch and shift register, the DPWM further compromising a PWM counter, a frequency counter and a jam control circuit, a method to control the PWM counter, frequency counter and jam control circuit comprising:

setting the DPWM output signal to a preselected logical state;

waiting for an input signal to indicate that the DPWM is to be selected by the user microcomputer;

waiting for 24 bits of data to be input to the DPWM;

jamming the data into the PWM and frequency counters;

waiting for an input signal to indicate that the DPWM is to be deselected;

resetting the DPWM output signal;

monitoring the PWM counter for a roll over condition;

monitoring the frequency counter for a roll over condition if the PWM counter has not yet rolled over;

returning to monitor the PWM counter for a roll over condition if the frequency counter has not yet rolled over;

setting the DPWM output if the PWM counter has rolled over;

waiting for the frequency counter to roll over;

jamming new data into the PWM and frequency counters if the frequency counter has rolled over and resetting the DPWM output.

* * * * *